United States Patent [19]
Kato et al.

[11] Patent Number: 5,604,763
[45] Date of Patent: Feb. 18, 1997

[54] GROUP III NITRIDE COMPOUND SEMICONDUCTOR LASER DIODE AND METHOD FOR PRODUCING SAME

[75] Inventors: Hisaki Kato, Toyohashi; Norikatsu Koide, Nagoya; Masayoshi Koike, Ichinomiya; Isamu Akasaki; Hiroshi Amano, both of Nagoya, all of Japan

[73] Assignees: Toyoda Gosei Co., Ltd.; Research Development of Japan; Isamu Akasaki; Hiroshi Amano, all of Aichi, Japan

[21] Appl. No.: 423,940

[22] Filed: Apr. 19, 1995

[30] Foreign Application Priority Data

Apr. 20, 1994  [JP]  Japan .................................. 6-106057
Apr. 20, 1994  [JP]  Japan .................................. 6-106058

[51] Int. Cl.$^6$ ........................................................ H01S 3/19
[52] U.S. Cl. ............................................................. 372/45
[58] Field of Search ................................ 372/44, 45, 46

[56] References Cited

U.S. PATENT DOCUMENTS 5,247,533  9/1993  Okazaki et al. ......................... 372/45
5,306,662  4/1994  Nakamura et al. .................. 372/46 X

FOREIGN PATENT DOCUMENTS

0496030A3  7/1992  European Pat. Off. .

OTHER PUBLICATIONS

S. T. Kim, H. Amano, I. Akasaki; N, Koide; Optical Gain of Optically Pumpted Al$^{0.1}$Ga$^{0.9}$N/GaN Double Heterostructure at Room Temperature; Applied Physics Letters 64; Mar. 21, 1994, No. 12, pp. 1535–1536.

Takashi Matsuoka, Toru Sasaki, Akinori Katsui; Growth and Properties of A Wide–Gap Semiconductor InGaN; Optoelectronics Devices and Technologies 5 (1990) Jun., No. 1, pp. 53–64.

European Search Report; Aug. 8, 1995.

Takashi Matsuoka; Akira Ohki; Tetsuichiro Ohno, Yoshihiro Kawaguchi; Comparison of GaN– And ZnSe–Based Materials For Light Emitters; 2300 Journal of Crystal Growth 138 (1994) Apr. 11, Nos. 1/4, pp. 727–736.

*Primary Examiner*—James W. Davie
*Attorney, Agent, or Firm*—Cushman Darby & Cushman IP Group of Pillsbury Madison & Sutro LLP

[57] ABSTRACT

An improved laser diode is made of a gallium nitride compound semiconductor $((Al_xGa_{1-x})_yIn_{1-y}N;\ 0 \leq x \leq 1;\ 0 \leq x \leq 1)$ with a double heterojunction structure having the active layer held between layers having a greater band gap. The laser diode comprises mirror surfaces formed by cleaving the multi-layered coating and the sapphire substrate in directions parallel to <0001> (c axis) of the sapphire substrate. The intermediate zinc oxide (ZnO) layer is selectively removed by wet etching with a ZnO-selective liquid etchant so as to form gaps between the sapphire substrate and the bottom-most sub-layer of the semiconductor laser element layer. The semiconductor laser element layer is cleaved with the aid of the gaps, and the resulting planes of cleavage are used as the mirror surfaces of the laser cavity.

8 Claims, 4 Drawing Sheets

GROUP III NITRIDE COMPOUND SEMICONDUCTOR LASER DIODE AND METHOD FOR PRODUCING SAME

BACKGROUND OF THE INVENTION

1. Field of the Invention

The present invention relates to semiconductor laser diodes capable of light emission at a single wavelength in the visible range, particularly from the blue to the violet range, as well as in the ultraviolet range, and a method for producing group III nitride compound semiconductor lasers.

2. Description of Background Information

The laser diode proposed in Unexamined Japanese Patent Publication (kokai) Hei-4-242985 is fabricated from gallium nitride based compound semiconductors $((Al_xGa_{1-x})_yIn_{1-y}N; 0 \leq x \leq 1; 0 \leq y \leq 1)$, with the active layer being undoped with impurities.

Furthermore, that reference discloses group III nitride compound semiconductor lasers fabricated by creating p-type conduction in $(Al_xGa_yIn_{1-x-y}N;$ including the cases of x=0, y=0 and x=y=0) through exposure to electron beams. Such semiconductor lasers have an AlN buffer layer formed on a sapphire substrate which, in turn, is overlaid with a pn heterojunction in a group III nitride compound semiconductor $(Al_xGa_yIn_{1-x-y}N;$ including the cases of x=0, y=0 and x=y=0).

This laser diode is fabricated by epitaxial growth of a gallium nitride compound semiconductor on a sapphire substrate. For the manufacture of reliable laser diodes, it is necessary to provide precise mirror surfaces; however, no one has ever succeeded in finding the directions of cleavage capable of providing precise mirror surfaces.

Furthermore, these lasers require cleaving of not only the group III nitride compound semiconductor laser elemont layers but also of the sapphire substrate. However, it is difficult to cleave the sapphire substrate per se; additionally, the 30° offset between the A axis of sapphire and that of the group III nitride compound semiconductor makes it impossible to create cleavage surfaces of high quality in the group III nitride compound semiconductor laser element layer.

SUMMARY OF THE INVENTION

The present inventors conducted experiments in which they changed the orientation of a principal plane of the sapphire substrate, had gallium nitride based compound semiconductors grown epitaxially on the substrate, cleaved the grown layer in a plurality of directions and examined the precision of the cleavage planes. As it turned out, cleavage planes of good precision were obtained when gallium nitride based semiconductors compound were grown epitaxially on the surface a of the sapphire substrate, with the grown semiconductor layers being subsequently cleaved parallel to the direction of c axis of the substrate.

An object of the present invention is to provide a gallium nitride compound semiconductor laser diode in which both end faces of the laser cavity are sufficiently improved in the degree of parallelism and surface precision to assure a higher efficiency in laser oscillation.

Another object of the present invention is to provide a laser element layer that is formed of a group III nitride compound semiconductor over a sapphire substrate and which is provided with cleavage planes of sufficiently high quality to produce a higher laser output.

The above-stated object of the invention can be attained by a laser diode made of a gallium nitride compound semiconductor $((Al_xGa_{1-x})_yIn_{1-y}N; 0 \leq x \leq 1; 0 \leq y \leq 1)$ with a double heterojunction structure having the active layer held between layers having a greater band gap, which comprises:

a sapphire substrate having a (1,1–2,0) plane (face a) as a principal plane;

a multi-layered coating formed of a gallium nitride compound semiconductor $((Al_xGa_{1-x})_yIn_{1-y}N; 0 \leq x \leq 1; 0 \leq y \leq 1)$ in said double heterojunction structure on said sapphire substrate either directly or in the presence of an intervening buffer layer; and mirror surfaces formed by cleaving said multi-layered coating and said sapphire substrate in directions parallel to <0001> (c axis) of said sapphire substrate.

According to the invention, multiple layers of a gallium nitride compound semiconductor are formed on face a of a sapphire substrate to make a laser element and are cleaved along two lines parallel to the c axis of the substrate, providing two opposite end faces of the laser cavity. The thus formed end faces are sufficiently improved in the degree of parallelism and the precision of specularity to ensure higher efficiency in laser output.

Another object of the invention can be attained by a process for producing a III nitride compound semiconductor laser comprising the steps of:

forming an intermediate layer of zinc oxide (ZnO) in one region over a sapphire substrate and an intermediate layer of aluminum nitride (AlN) in another region;

forming a semiconductor laser element layer made of a plurality of sub-layers of a group III nitride compound semiconductor $(Al_xGa_yIn_{1-x-y}N;$ including the cases of x=0, y=0 and x=y=0) over the intermediate layers;

selectively removing the intermediate layer of zinc oxide (ZnO) by wet etching with a ZnO-selective liquid etchant so as to form gaps between said sapphire substrate and the lower-most sub-layer of said semiconductor laser element layer; and cleaving said semiconductor laser element layer with the aid of said gape, with the resulting planes of cleavage being used as the mirror surfaces of the laser cavity.

Zinc oxide (ZnO) and AlN have lattice constants close to those of group III nitride compound semiconductors $(Al_x Ga_yIn_{l-x-y}N;$ including the cases of x=0, y=0 and x-y-0) and both substances will serve as buffer layers which aid in the grown of III nitride compound semiconductors of high quality over the sapphire substrate. By selectively etching away only the intermediate layer of zinc oxide (ZnO), one can form gaps between the sapphire substrate and the III nitride compound semiconductor laser element layer in the etched area. These gaps may be used as a guide for selective cleaving of the III nitride compound semiconductor laser element layer, thereby creating mirror surfaces of sufficiently high quality to permit the formation of a reliable laser cavity. This in turn contributes to a marked improvement in the output power of the laser element.

DETAILED DESCRIPTION OF PREFERRED EMBODIMENTS

First Embodiment

The invention will now be described with reference to a specific example.

Figure 1:
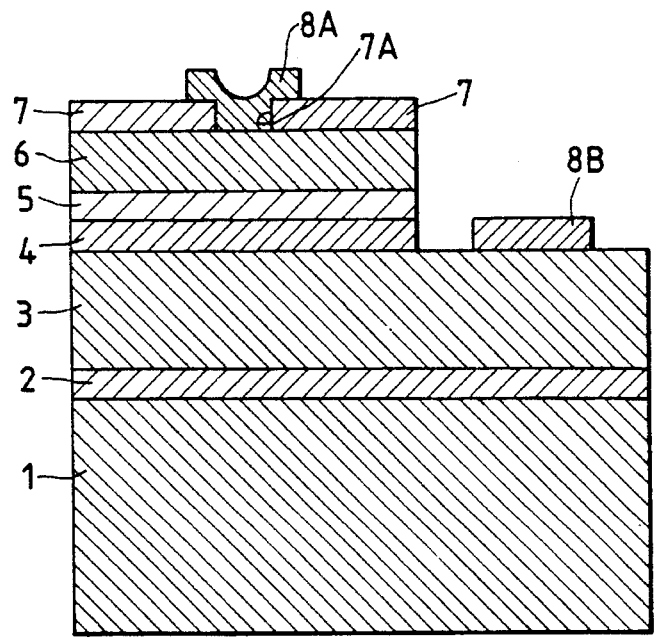
FIG. 1 is a sectional view showing the structure of a compound $((Al_xGa_{l-x})_yIn_{l-y}N; 0 \leq x \leq 1; 0 \leq y \leq 1)$ semiconductor laser diode that was fabricated on a sapphire substrate according to a specific example of the invention.

FIG. 1 is a sectional view showing the structure of a semiconductor laser diode using a sapphire substrate 1. The sapphire substrate 1 is adapted for crystal growth on a (1,1-2,0) surface (face a). It was cleaned with an organic chemical and set up on the crystal growth portion of a suitable apparatus. The growth surface was evacuated, supplied with hydrogen and heated to a temperature of about 1200° C., whereby the hydrocarbon gases deposited on a principal surface of the substrate 1 were removed to some extent.

The substrate 1 was then cooled to a temperature of about 600° C. and trimethyl aluminum (TMA) and ammonia ($NH_3$) were supplied to form an AlN layer 2 with a thickness of about 50 nm on the substrate 1.

In the next step, only the supply of TMA was stopped and the substrate temperature was raised to 1040° C., followed by the supply of trimethyl gallium (TMG) and silane ($SiH_4$) to have a Si-doped, n-type GaN layer 3 ($n^+$ layer) formed on the AlN layer 2.

The wafer was recovered from the growth furnace and part of the surface of the GaN layer 3 was masked with $SiO_2$. The wafer was returned to the growth furnace, which was evacuated, supplied with hydrogen and $NH_3$, and heated again to 1040° C.

Subsequently, TMA, TMG and $SiH_4$ were supplied to form a Si-doped $Al_{0.1}Ga_{0.5}N$ layer 4 (n layer) with a thickness of 0.5 μm in the areas not masked with $SiO_2$.

In the next step, TMG and $SiH_4$ were supplied to have a GaN layer 5 (active layer) grown in a thickness of 0.2 μm.

Thereafter, TMA, TMG and $Cp_2Mg$ (biscyclopentadienyl magnesium) were supplied to form a Mg-doped $Al_{0.1}Ga_{0.5}N$ layer 6 (p layer) in a thickness of 0.5 μm.

The mask $SiO_2$ was then stripped with a fluoric acid base etchant.

After depositing a $SiO_2$ layer 7 over the $Al_{0.1}Ga_{0.9}N$ layer 6 (p layer), a slit window 7A (1 mm×50 μm) was formed in the $SiO_2$ layer 7. The thus processed wafer was then transferred into a vacuum chamber, in which the Mg-doped $Al_{0.1}Ga_{0.5}N$ layer 6 was exposed to electron beams. The layer 6 eventually exhibited p-type conduction.

Typical conditions for exposure to electron beams are listed below in Table 1.

TABLE 1

| Acceleration voltage | 15 kV |
| --- | --- |
| Emission current | ≧120 μA |
| Beam spot Size | 60 μmφ |
| Sample Temperature | 297K |

The window 7A in the doped AlGaN layer 6 (p layer) and the GaN layer 3 ($n^+$ layer) were furnished with metal electrodes 8A and 8B, respectively.

A plurality of such devices were formed on a single wafer of sapphire substrate 1 and cut apart with a diamond cutter in directions parallel to the optical path of each cavity and by means of cleavage in directions perpendicular to the optical path (i.e., normal to the paper).

Figure 2:
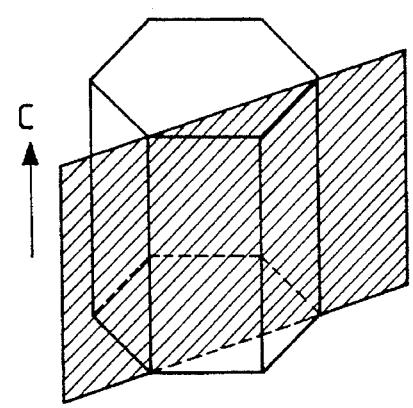
FIG. 2 is a diagram illustrating the crystal structure of sapphire.
Figure 3:
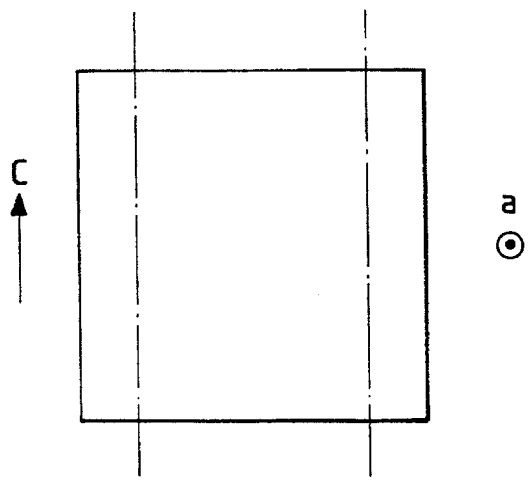
FIG. 3 is a diagram illustrating the relationship between the face a and the c axis of the sapphire substrate, as well as the direction of its cleavage.
Figure 4:
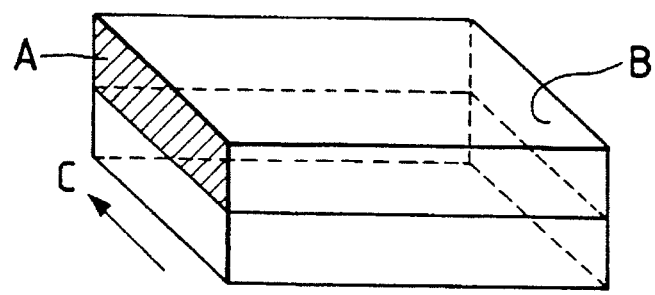
FIG. 4 is a perspective view of a laser element having two cleavage planes.

The sapphire crystal is a hexagonal prism as shown in FIG. 2, in which the relationship between the c axis and the face a is also shown. Obviously, the c axis lies in the plane of face a of the sapphire substrate 1. Hence, the sapphire substrate 1 and the overlying layers 2–8 are cleaved along two lines, as shown in FIG. 3, producing a laser cavity whose end faces A and B are specular.

Sapphire substrates 250–300 μm that had GaN grown on the face a could be readily cleaved in directions parallel to the c axis of the substrate, but could be cleaved only with much difficulty in directions not parallel to the c axis. When GaN was grown on face c of sapphire substrates, it was difficult to create a laser cavity with an enhanced degree of parallelism between both end faces since the substrates readily broke in all directions. It should be noted that the crystal direction of GaN aligned with the c axis, irrespective of whether it was grown on face a or c of the sapphire substrate.

Therefore, one can understand from these experimental data that planes of the highest surface precision are achieved if GaN grown on face a of a sapphire substrate is cleaved in directions parallel to the c axis of the substrate.

Second Embodiment

The invention will now be described with reference to a specific example, in which a single crystal for semiconductor ($Al_xGa_yIn_{1-x-y}N$) including the cases of x=0, y=0 and x=y=0 was prepared with a horizontal organometallic compound vapor-phase growth apparatus.

Figure 5:
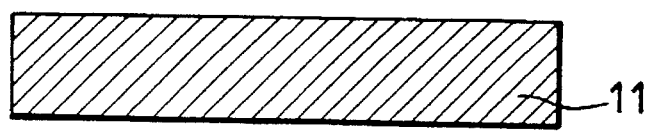
FIG. 5 is a sectional view showing the first stop of a process for producing a semiconductor laser according to a specific example of the invention.
Figure 6:
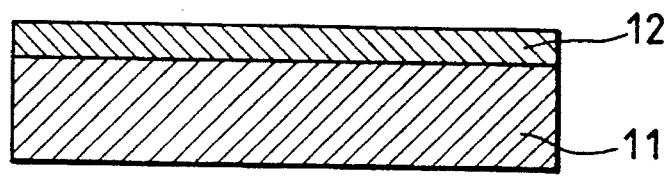
FIG. 6 is a sectional view showing the second step of the process.

A sapphire substrate 11 having a plane direction (0001) was provided and cleaned with an organic chemical such as methanol (see FIG. 5). The clean substrate was set up in the chamber of an RF sputtering apparatus, which was then evacuated. Thereafter, a ZnO target was sputtered with a gaseous mixture of argon and oxygen to form an intermediate ZnO layer 12 with a uniform thickness of 100 nm on top of the sapphire substrate 11 (see FIG. 6).

Subsequently, a uniform photoresist coat was applied onto the intermediate ZnO layer 12, exposed to light in a predetermined pattern and developed to leave the photoresist intact in the areas where the intermediate ZnO layer 12 would be left unetched. Those areas of intermediate ZnO layer 12 which were not masked with the predetermined photoresist pattern were etched away with aqua regia.

Figure 7:
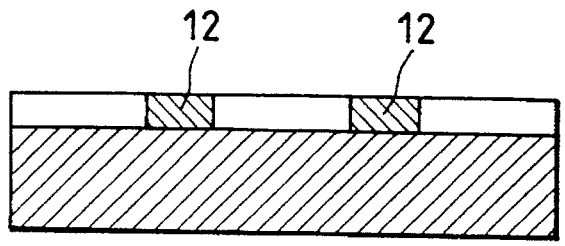
FIG. 7 is a sectional view showing the third step of the process.
Figure 8:
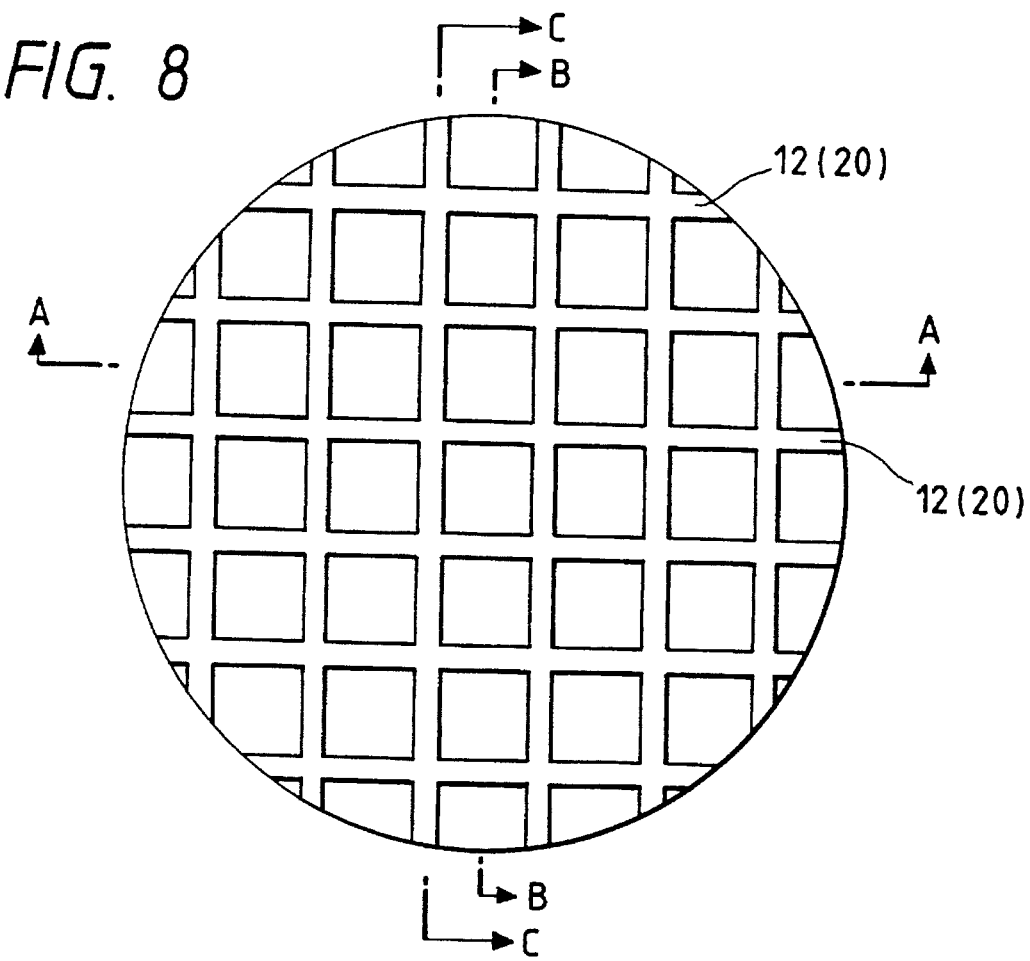
FIG. 8 is a plan view showing an array of light-emitting diode chips in process of fabrication by the method of the example.

Thus, a grid pattern of intermediate ZnO layer 12 was formed as shown in FIGS. 7 and 8. The sapphire substrate 11 having this ZnO pattern was cleaned with an organic chemical and set up in the crystal growth portion of the growth apparatus. The growth furnace was evacuated, supplied with hydrogen and heated to a temperature about 1200° C., whereby the hydrogen gases deposited on a principal surface of the substrate 11 were removed to some extent.

Figure 9:
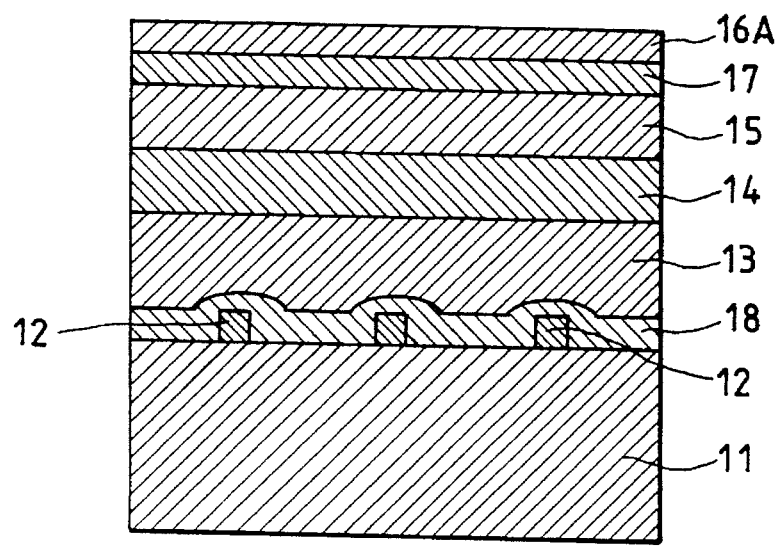
FIG. 9 is section A—A of FIG. 8.
Figure 10:
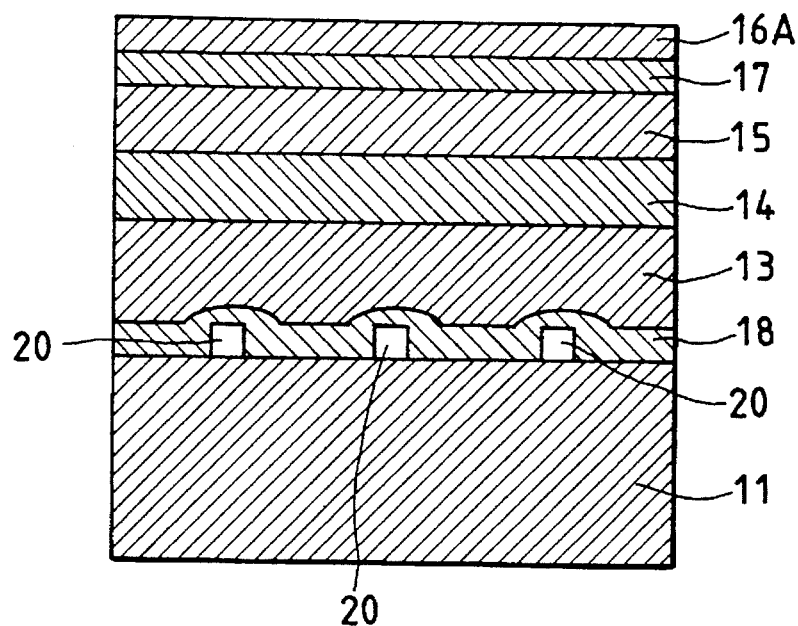
FIG. 10 is section B—B of FIG. 8.
Figure 11:
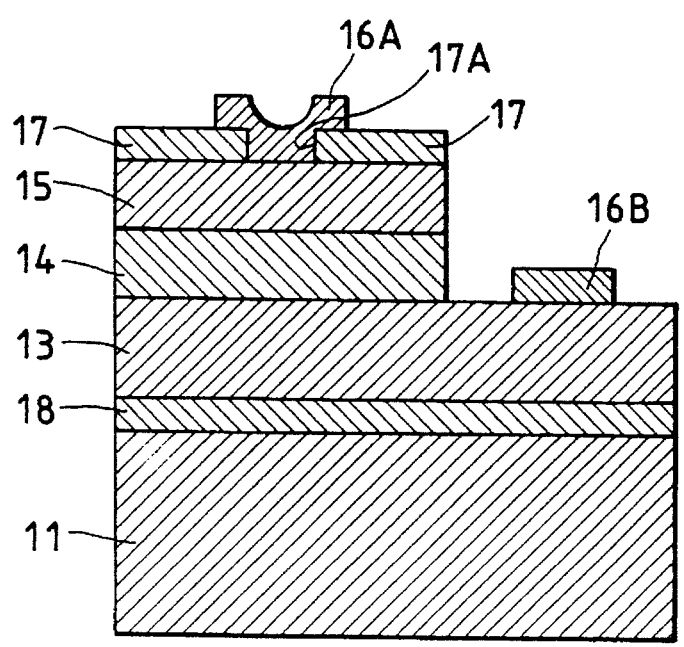
FIG. 11 is a sectional view showing the last step of the process for fabrication of a light-emitting diode by the method of the example.

The steps of forming a semiconductor laser element layer on the thus processed sapphire substrate 11 will now be described with reference to FIGS. 9–11. FIG. 9 is a section A—A of FIG. 8, and FIG. 10 is a section B—B of FIG. 8. In other words, the direction in which FIG. 8 is cut to produce section A—A is perpendicular to the direction in which FIG. 8 is cut to produce section B—B.

The substrate 11 was cooled to a temperature of about 600° C. and trimethyl aluminum (TMA) and ammonia ($NH_3$) were supplied to form an AlN layer 18 with a uniform thickness of about 50 nm on the substrate 11 (see FIG. 9). Subsequently, only the supply of TMA was stopped and the substrate temperature was raised to 1040° C., followed by the supply of TMA, trimethyl gallium (TMG) and silane ($SiH_4$) to have a Si-doped, n-type GaAlN layer 13 (n layer) formed on the AlN layer 18.

The wafer was recovered from the growth furnace and part of the surface of GaAlN layer 13 was masked with $SiO_2$. The wafer was returned to the growth furnace, which was evacuated, supplied with hydrogen and $NH_3$, and heated again to 1040° C. Subsequently, TMG was supplied to have a GaN layer 14 grown in a thickness of 0.5 μm in the areas of the wafer that were unmasked with $SiO_2$ (see FIGS. 9 and 11). Thereafter, TMA and biscyclopentadienyl magnesium ($Cp_2Mg$) were supplied to form a Mg-doped GaAlN layer 15 (p layer) in a thickness of 0.5 μm (see FIGS. 9 and 11).

The mask $SiO_2$ was then stripped with a fluoric acid base etchant.

After depositing a $SiO_2$ layer 17 over the Mg-doped GaAlN layer 15 (p layer), a slit window 17A (1 mm×50 μm) was formed in the $SiO_2$ layer 17. The thus processed wafer was transferred into a vacuum chamber, in which the Mg-doped GaAlN layer 15 (p layer) was exposed to electron beams under the following conditions: acceleration voltage, 15 kV; emission current, $\geq 120$ μA; beam spot size, 60 μm; and sample temperature, 297K.

The window 17A in the Mg-doped GaAlN layer 15 (p layer) and the Si-doped GaAlN layer 13 (n layer) were furnished with metal electrodes 16A and 16B, respectively.

The sapphire substrate 11 with the group III nitride compound semiconductor laser element layer thus formed was dipped in a HCl base etchant that was held at 60° C. The substrate was then loaded in an ultrasonic cleaner for about 10 min so as to perform selective etching of the intermediate ZnO layer 12. As a result, the intermediate ZnO layer 12 shown in FIG. 8 was removed to form a grid pattern of gaps 20 between the sapphire substrate 11 and the Si-doped, n-type GaAlN layer 13 (n layer) which was the lower-most part of the semiconductor laser element layer (see FIG. 10).

In the next step, a sharp blade positioned right above each of the gaps 20 was compressed onto the top surface of the $SiO_2$ layer along line C—C of FIG. 8, whereby the semiconductor laser element layer composed of three sublayers, 15, 14 and 13, was cleaved. The resulting end faces of the cleavage would eventually serve as the mirror surfaces of a laser cavity.

Finally, dicing along the gaps 20 in a grid pattern produced a plurality of semiconductor laser chips.

In the example described above, the intermediate ZnO layer 12 was assumed to have a thickness of 100 nm but this is not the sole case of the invention and the intermediate layer 12 may be used in thicknesses ranging from 10 nm to 10 μm. Additionally, the active GaN layer 14 was sandwiched between the Mg-doped GaAlN layer 15 (p layer) and the Si-doped, n-type GaAlN layer 13 (n layer) to create a pn structure in the semiconductor laser by double heterojunction. It should, however, be noted that any other layer arrangements may be adopted by the semiconductor layer element as long as they are capable of forming a pn junction.

What is claimed is:

1. A laser diode made of a gallium nitride compound semiconductor satisfying the formula $(Al_xGa_{1-x})_yIn_{1-y}N$, $0 \leq x \leq 1$ $0 \leq y \leq 1$, said laser diode comprising a double heterojunction structure having an active layer held between layers having a greater band gap, said laser diode further comprising:

a sapphire substrate having a (1,1–2,0) plane, face a, as a principal plane;

a multi-layered coating formed of a gallium nitride compound semiconductor satisfying the formula $(Al_xGa_{1-x})_yIn_{1-y}N$, $0 \leq x \leq 1$; $0 \leq y \leq 1$, said multi-layered coating comprising said double heterojunction structure and being formed over said principal place of said sapphire substrate; and mirror surfaces formed by cleaving said multi-layered coating and said sapphire substrate in directions parallel to a <0001≦, c axis, of said sapphire substrate.

2. The laser diode according to claim 1, wherein said multi-layered coating is formed directly on said semiconductor substrate.

3. The laser diode according to claim 1, wherein said laser diode further comprises a buffer layer formed on said sapphire substrate, and wherein said multi-layered coating is formed directly on said buffer layer.

4. A laser diode comprising:

a semiconductor substrate having a (1,1–2,0) plane, face a, as a principal plane;

a multiple layer structure formed over said principal plane of said semiconductor substrate, said multiple layer structure comprising a plurality of layers formed of a group III nitride compound satisfying the formula $(Al_xGa_{1-x})_yIn_{1-y}N$, $0 \leq x \leq 1$, $0 \leq y \leq 1$, said plurality of layers together forming a heterojunction structure over said semiconductor substrate; and mirror surfaces formed by cleaving said multiple layer structure and said semiconductor substrate in directions parallel to <0001> c axis, of said semiconductor substrate.

5. The laser diode according to claim 4, wherein said heterojunction structure comprises a double heterojunction structure.

6. The laser diode according to claim 5, wherein said semiconductor substrate comprises a sapphire substrate.

7. The laser diode according to claim 6, wherein said multiple layer structure is formed directly on said semiconductor substrate.

8. The laser diode according to claim 7, wherein said laser diode further comprises a buffer layer formed on said semiconductor substrate, and wherein said multiple layer structure is formed directly on said buffer layer.

* * * * *